United States Patent
Chen et al.

(10) Patent No.: US 9,396,604 B2
(45) Date of Patent: Jul. 19, 2016

(54) VENDING MACHINE WITH HEAT TRANSMISSION SYSTEM

(71) Applicants: HONG FU JIN PRECISION INDUSTRY (WuHan) CO., LTD., Wuhan (CN); HON HAI PRECISION INDUSTRY CO., LTD., New Taipei (CN)

(72) Inventors: Yun-Lung Chen, New Taipei (TW); Chin-Wen Yeh, New Taipei (TW); Yang Xiao, Wuhan (CN); Kui Guo, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 514 days.

(21) Appl. No.: 13/972,248

(22) Filed: Aug. 21, 2013

(65) Prior Publication Data
US 2014/0179219 A1    Jun. 26, 2014

(30) Foreign Application Priority Data
Dec. 20, 2012 (CN) .......................... 2012 1 0557542

(51) Int. Cl.
G07F 11/00 (2006.01)
H05K 7/20 (2006.01)
G07F 9/10 (2006.01)

(52) U.S. Cl.
CPC ............ *G07F 9/105* (2013.01); *H05K 7/20136* (2013.01)

(58) Field of Classification Search
CPC .......... H05K 7/20136; H05K 7/20745; G07F 9/105; G07F 9/10; F16K 1/00; F16K 11/0873; F24F 11/0001; F24F 13/0236; F24F 13/04; F24F 2221/186; F24F 7/007; F24F 13/068; Y10T 137/86871; Y10T 137/8782; Y10T 74/1595; F25B 2400/01; F25B 2400/075; F25B 2600/0253; F25B 5/02; F25B 1/00; F25B 29/00; F25D 17/065; F25D 2700/04; F25D 2700/06; F25D 2700/123; F25D 27/005; F25D 29/00; F25D 31/005; F25D 11/04; F25D 11/00; E04F 15/02405
USPC ............... 454/237, 251, 242, 258; 222/146.1, 222/150 HC; 126/110 R, 100 A, 104 A, 112, 126/285 R; 137/625.47, 876; 251/315.14; 221/150 A, 279, 6; 312/236; 62/125, 62/186, 234, 378, 407; 74/167
See application file for complete search history.

(56) References Cited

U.S. PATENT DOCUMENTS

| | | | | |
|---|---|---|---|---|
| 2,446,788 A | * | 8/1948 | Rifkin | F25D 11/04 221/279 |
| 5,485,780 A | * | 1/1996 | Koether | F24C 15/006 219/400 |
| 7,188,490 B2 | * | 3/2007 | Jeong | F25D 17/062 62/298 |
| 8,087,261 B2 | * | 1/2012 | Lee | F25B 39/022 454/259 |
| 2007/0125104 A1 | * | 6/2007 | Ehlers | F25D 27/005 62/157 |

* cited by examiner

*Primary Examiner* — Steven B McAllister
*Assistant Examiner* — Reginald McNeill, II
(74) *Attorney, Agent, or Firm* — ScienBiziP, P.C.

(57) ABSTRACT

A vending machine with selectable internal heating and internal cooling functions includes a cabinet and a heat transmitting system. The cabinet includes a heat source and a goods storage space. The heat transmitting system includes a first air inlet tube, a second air inlet tube, an air outlet tube, and a gas valve. The first air inlet tube connects the heat source to the gas valve. The second air inlet tube connects the goods storage space to the gas valve. The air outlet tube connects the gas valve to the outside of the vending machine. The gas valve can connect the first gas inlet tube to the second gas inlet tube to heat the goods storage space using heat generated by the heat source, or can connect the first gas inlet tube to the gas outlet tube to dissipate heat generated by the heat source.

16 Claims, 4 Drawing Sheets

VENDING MACHINE WITH HEAT TRANSMISSION SYSTEM

BACKGROUND

1. Technical Field

The present disclosure generally relates to a vending machine, and particularly to a vending machine with a heat transmission system.

2. Description of Related Art

A vending machine provides twenty-four hours services. Different kinds of goods are provided by the vending machine. However, these goods are stored and dispensed in normal temperatures. Hot beverages and hot foods often can not be sold by the vending machine. On the other hand, the vending machine often generates heat when running which can be problematic.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
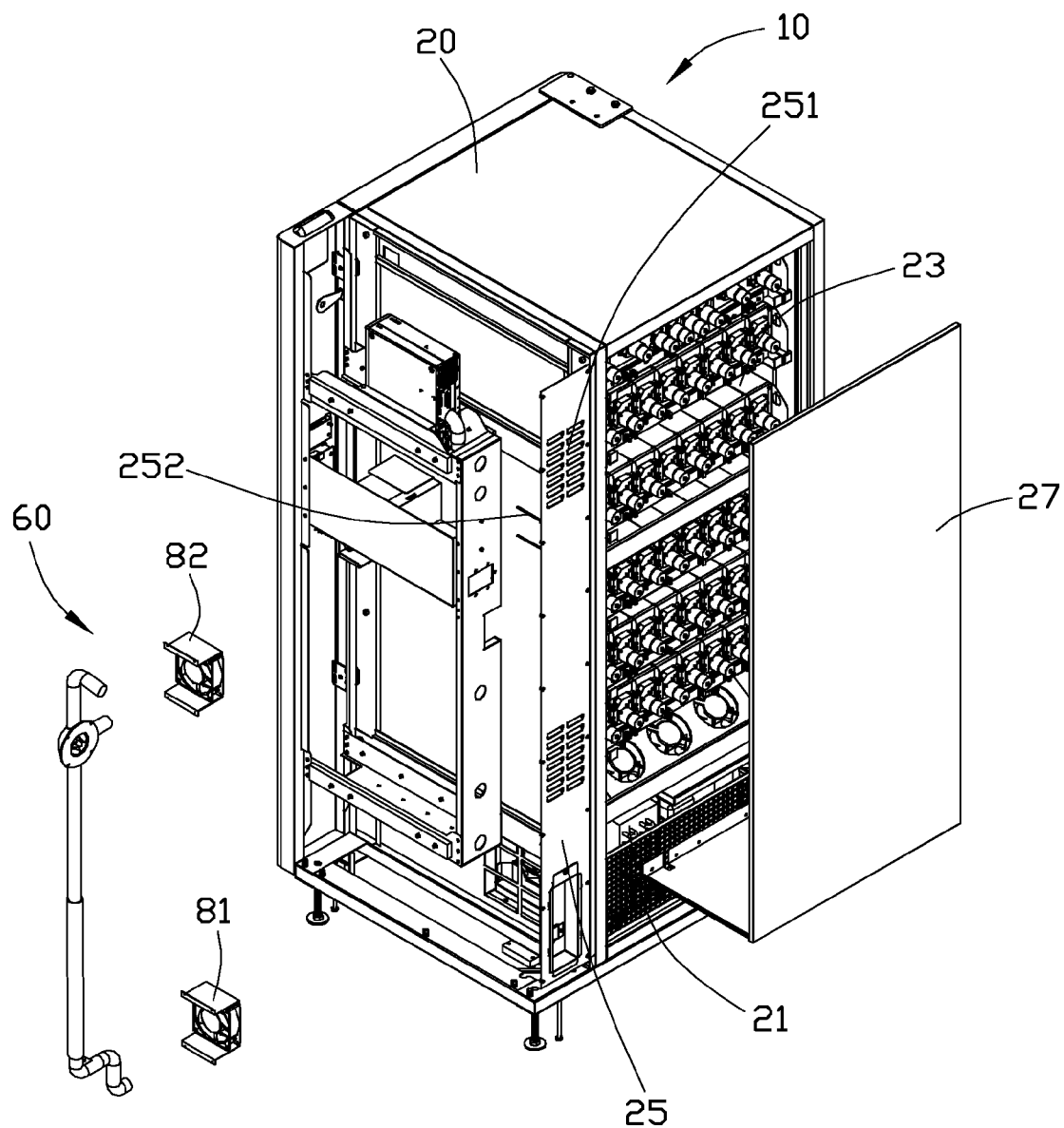
FIG. 1 is an exploded and isometric view of an embodiment of a vending machine which includes a heat transmission system.
Figure 2:
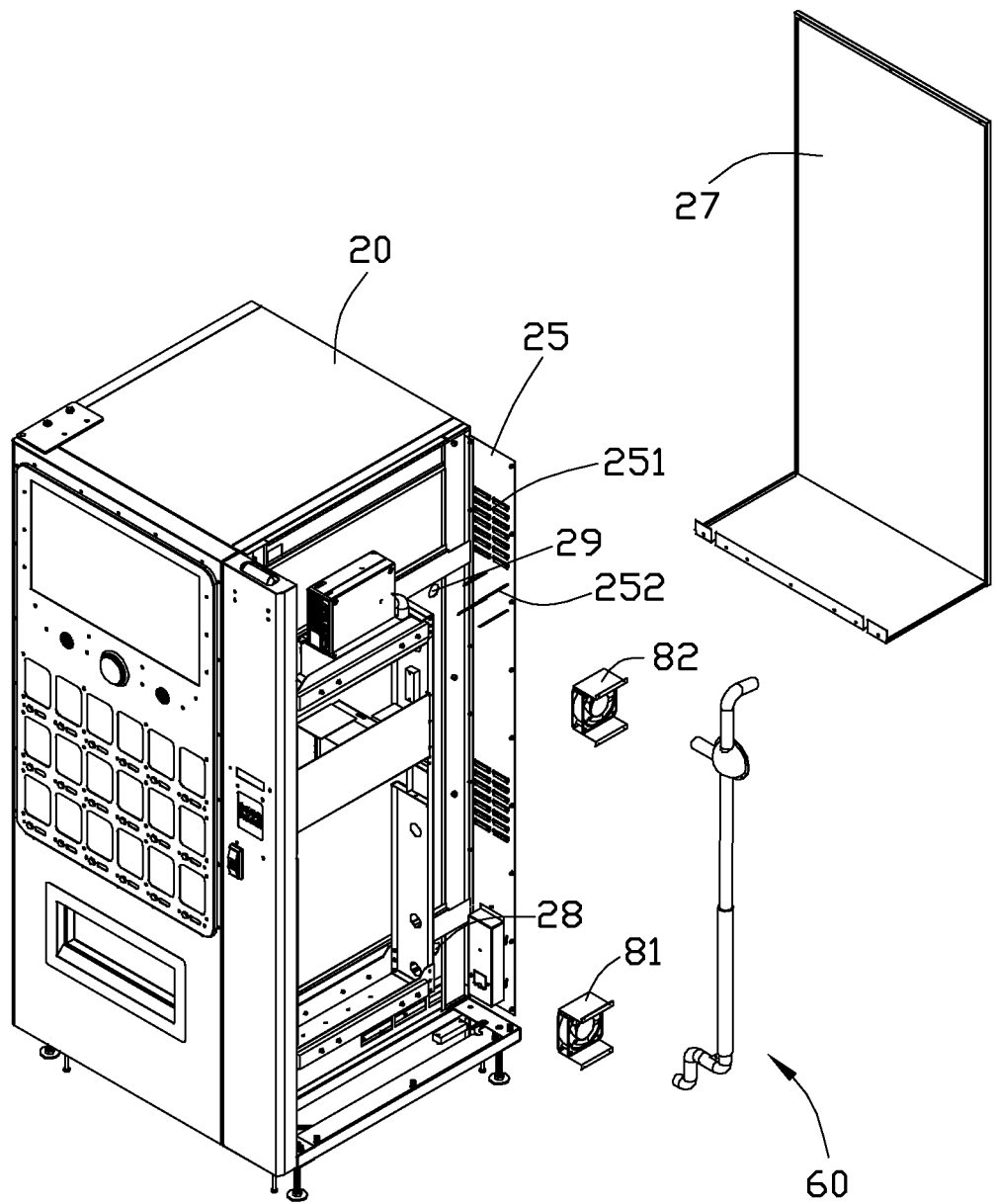
FIG. 2 is similar to FIG. 1, but viewed from another aspect.

FIG. 1 shows an embodiment of a vending machine 10 with a heat transmission system 60. The vending machine 10 includes a cabinet 20.

A heat source 21 is mounted on a bottom portion of the cabinet 20. In one embodiment, the heat source 21 is a compressor or a power source of the vending machine 10. The heat source 21 generates heat when the vending machine 10 runs. The cabinet 20 defines a goods storage space 23 located above the heat source 21. A rear plate 27 is mounted on a rear side of the cabinet 20 to seal the goods storage space 23. A mounting plate 25 is mounted on the cabinet 20. The mounting plate 215 defines a plurality of air holes 251. A plurality of mounting pins 252 is formed on the mounting plate 215. The cabinet 20 defines a first through hole 28 and a second through hole 29 adjacent the mounting plate 25. The second through hole 29 is located above the first through hole 28. The first through hole 28 communicates with the heat source 21. The second through hole 29 communicates with the goods storage space 23.

Figure 3:
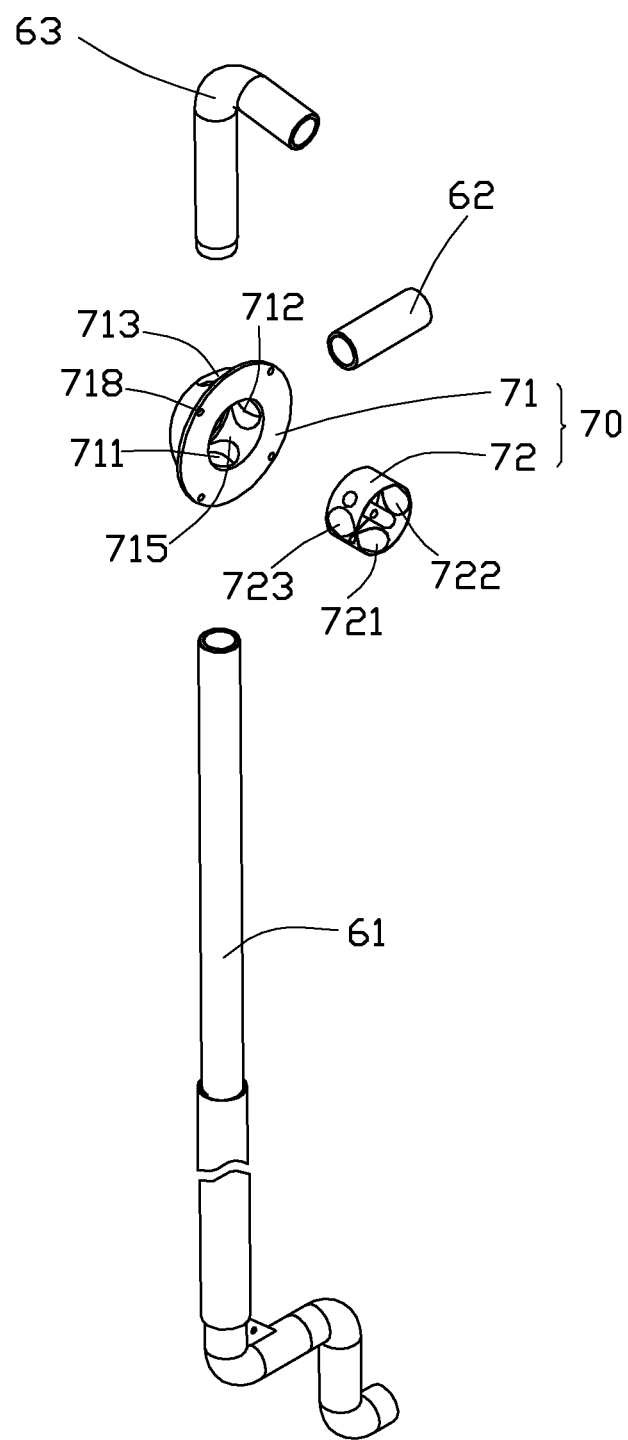
FIG. 3 is an exploded and isometric view of the heat transmission system of FIG. 1.
Figure 4:
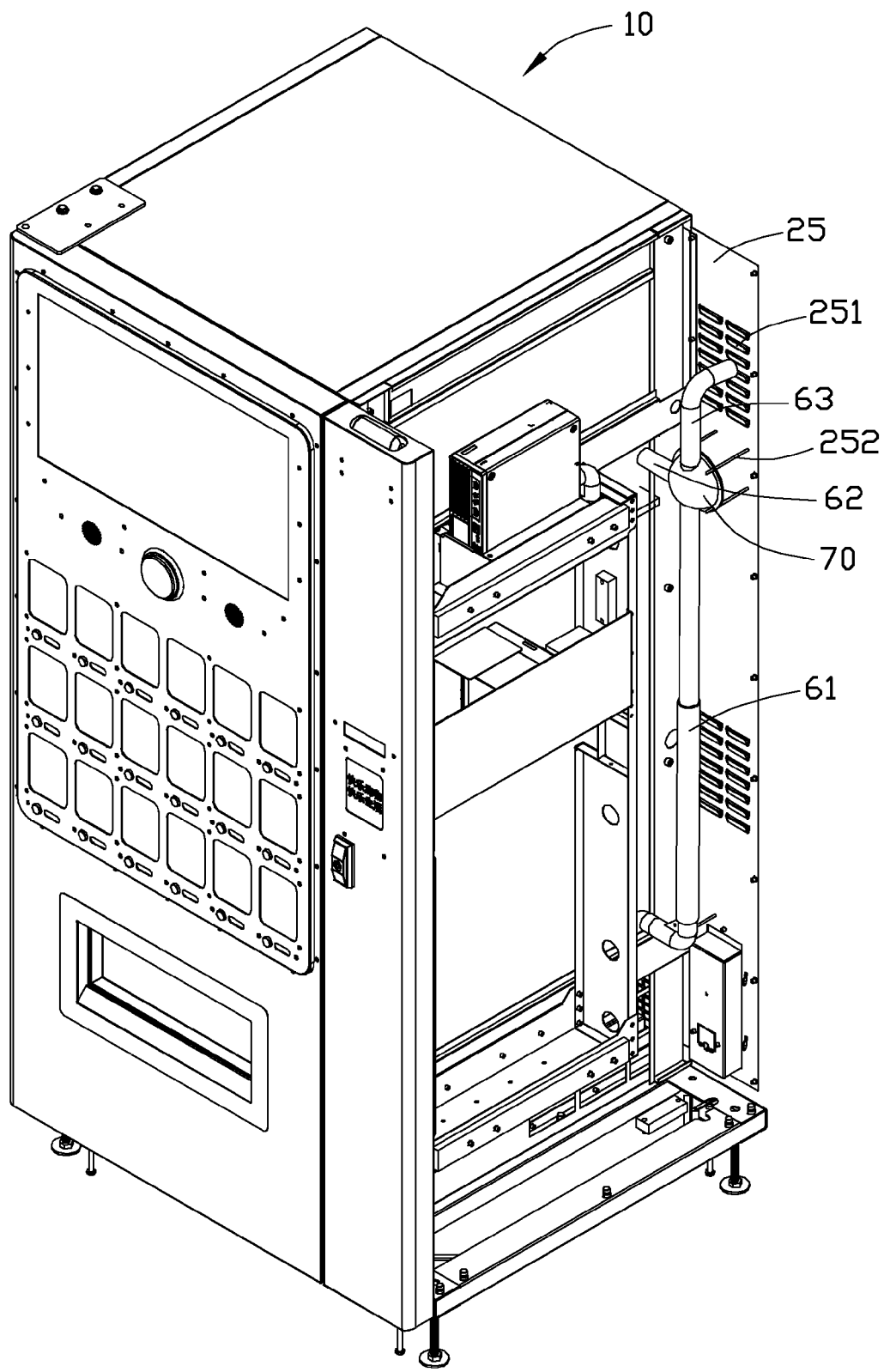
FIG. 4 is an assembled and isometric view of the vending machine of FIG. 1.

Referring to FIGS. 1 and 3, the heat transmission system 60 includes a first air inlet tube 61, a second air inlet tube 62, an air outlet tube 63, a gas valve 70, an air exhausting fan 81, and an air aspirating fan 82. The gas valve 70 includes a valve body 71 and a valve spool 72.

A center portion of the valve body 71 defines a receiving hole 715 for receiving the valve spool 72. An outer wall of the valve body 71 defines a first connection hole 711, a second connection hole 712, and a third connection hole 713. All of the first connection hole 711, the second connection hole 712, and the third connection hole 713 communicate with the receiving hole 715. The first connection hole 711 is defined in a bottom portion of the valve body 71. The second connection hole 712 is defined in a right portion of the valve body 71. The third connection hole 713 is defined in a top portion of the valve body 71. An extending direction of the first connection hole 711 is same as an extending direction of the third connection hole 713. The extending direction of the first connection hole 711 is perpendicular to an extending direction of the second connection hole 712. The valve body 71 defines a plurality of mounting holes 718.

The valve spool 72 is formed in a ring. An outer wall of the valve spool 72 defines a first vent hole 721, a second vent hole 722, and a third vent hole 723. All of the first vent hole 721, the second vent hole 722, and the third vent hole 723 communicate with each other. An extending direction of the second vent hole 722 is same as an extending direction of the third vent hole 723. The extending direction of the second vent hole 722 is perpendicular to an extending direction of the first vent hole 721. The valve spool 17 can be accommodated in the receiving hole 715 and rotatable in the receiving hole 715.

Referring to FIGS. 1 to 4, in assembly, a first end of the first air inlet tube 61 is inserted in the first connection hole 711 of the valve body 71. A first end of the second air inlet tube 62 is inserted in second connection hole 712 of the valve body 71. A first end of the air outlet tube 63 is inserted in the third connection hole 713 of the valve body 71. Then, the valve spool 72 is placed in the receiving hole 715 of the valve body 71. The valve spool 72 rotates in the receiving hole 715 between a first position and a second position. At the first position, the first vent hole 721 is aligned to and communicates with the first connection hole 711, the second vent hole 722 is aligned to and communicates with the second connection hole 712, and the third connection hole 713 is blocked by the outer wall of the valve spool 72. At the second position, the second vent hole 722 is aligned to and communicates with the first connection hole 711, the third vent hole 723 is aligned to and communicates with the third connection hole 713, and the second connection hole 712 is blocked by the outer wall of the valve spool 72.

In sequence, the air exhausting fan 81 is secured on the cabinet 20 to be aligned to the first through hole 28. The air aspirating fan 82 is secured on the cabinet 20 to be aligned to the second through hole 29. A second end of the first air inlet tube 61 is inserted in the first through hole 28 to be aligned to the air exhausting fan 81. A second end of the second air inlet tube 62 is inserted in the second through hole 29 to be aligned to the air aspirating fan 82. The mounting pin 252 of the cabinet 20 is inserted in the mounting hole 718 of the valve body 71. At this position, a second end of the air outlet tube 63 is aligned to the air hole 251 of the mounting plate 25. Thereby, the heat transmission system 60 is mounted on the cabinet 20.

When the goods storage space 23 needs to be heated, the valve spool 72 is rotated to the first position. Heat generated by the heat source 21 is absorbed into the first air inlet tube 61. The heat is then transmitted to the second air inlet tube 62 via the gas valve 70. The air aspirating fan 82 transmits heat from the second air inlet tube 62 into the goods storage space 23.

When the goods storage space 23 does not need to be heated, the valve spool 72 is rotated to the second position. Heat generated by the heat source 21 is absorbed into the first air inlet tube 61 and transmitted to the air outlet tube 63 via the gas valve 70. The heat is discharged from the air hole 251 of the vending machine 10.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A vending machine, comprising:
   a vending machine cabinet comprising a heat source and a goods storage space; and
   a heat transmitting system comprising a first air inlet tube, a second air inlet tube, an air outlet tube, and a gas valve, the first air inlet tube receiving heated air heated by the heat source to the gas valve, the second air inlet tube connecting the goods storage space to the gas valve, the air outlet tube communicating the gas valve to an area outside the vending machine cabinet, wherein when heating the goods storage space by heat generated by the heat source, the gas valve connects the first gas inlet tube to the second gas inlet tube, and when dissipating heat from the heat source, the gas valve connects the first gas inlet tube to the gas outlet tube, and wherein the gas valve is a spool valve, and the heat source is a compressor of the vending machine or a power source of the vending machine.

2. The vending machine of claim 1, wherein an outer wall of the valve body defines a first connection hole, a second connection hole, and a third connection hole, each of the first connection hole, the second connection hole, and the third connection hole communicates with the receiving hole, a first end of the first air inlet tube is inserted into the first connection hole, a first end of the second air inlet tube is inserted into the second connection hole, a first end of the air outlet tube is inserted into the third connection hole, and the first connection hole is connected to the second connection hole or to the third connection hole by rotating the valve spool rotates in the receiving hole.

3. The vending machine of claim 2, wherein an extending direction of the first connection hole is same as an extending direction of the third connection hole, and the extending direction of the first connection hole is perpendicular to an extending direction of the second connection hole.

4. The vending machine of claim 2, wherein an outer wall of the valve spool defines a first vent hole, a second vent hole, and a third vent hole, each of the first vent hole, the second vent hole, and the third vent hole is connected with each other, the valve spool rotates in the receiving hole between a first position and a second position; at the first position, the first vent hole is aligned and connected to the first connection hole, the second vent hole is aligned and connected to the second connection hole, and the third connection hole is blocked by the outer wall of the valve spool; at the second position, the second vent hole is aligned and connected to the first connection hole, the third vent hole is aligned and connected to the third connection hole, and the second connection hole is blocked by the outer wall of the valve spool.

5. The vending machine of claim 4, wherein an extending direction of the second vent hole is same as an extending direction of the third vent hole, the extending direction of the second vent hole is perpendicular to an extending direction of the first vent hole.

6. The vending machine of claim 1, wherein the heat transmitting system comprises an air exhausting fan and an air aspirating fan, the air exhausting fan is located between the first air inlet tube and the heat source, and the air aspirating fan is located between the second air inlet tube and the goods storage space.

7. The vending machine of claim 6, wherein the cabinet defines a first through hole and a second through hole, a second end of the first air inlet tube is inserted into the first through hole to be aligned to the air exhausting fan, and a second end of the second air inlet tube is inserted into the second through hole to be aligned to the air aspirating fan.

8. The vending machine of claim 1, wherein the cabinet comprises a plurality of mounting pins, the gas valve defines a plurality of mounting holes, and each of the plurality of mounting pins is inserted into each of the plurality of mounting holes.

9. A vending machine, comprising:
   a vending machine cabinet comprising a heat source and a goods storage space; and
   a heat transmitting system comprising a first air inlet tube, a second air inlet tube, an air outlet tube, and a gas valve, the gas valve comprising a valve body and a valve spool, the first air inlet tube receiving heated air heated by the heat source to the valve body, the second air inlet tube connecting the goods storage space to the valve body, the air outlet tube communicating the valve body to an area outside the vending machine cabinet, and the valve spool is configured to rotate in the valve body between a first position and a second position; at the first position, the goods storage space is heated by heat generated by the heat source by connecting the first gas inlet tube to the second gas inlet tube in the valve body via the valve spool; and at the second position, the heat source is cooled by connecting the first gas inlet tube to the gas outlet tube in the valve body via the valve spool, and wherein the heat source is a compressor of the vending machine or a power source of the vending machine.

10. The vending machine of claim 9, wherein an outer wall of the valve body defines a first connection hole, a second connection hole, and a third connection hole, each of the first connection hole, the second connection hole, and the third connection hole communicates with the receiving hole, a first end of the first air inlet tube is inserted into the first connection hole, a first end of the second air inlet tube is inserted into the second connection hole, a first end of the air outlet tube is inserted into the third connection hole.

11. The vending machine of claim 10, wherein an extending direction of the first connection hole is same as an extending direction of the third connection hole, and the extending direction of the first connection hole is perpendicular to an extending direction of the second connection hole.

12. The vending machine of claim 10, wherein an outer wall of the valve spool defines a first vent hole, a second vent hole, and a third vent hole, each of the first vent hole, a second vent hole, and a third vent hole is connected with each other; at the first position, the first vent hole is aligned and connected to the first connection hole, the second vent hole is aligned and connected to the second connection hole, and the third connection hole is blocked by the outer wall of the valve spool; at the second position, the second vent hole is aligned and connected to the first connection hole, the third vent hole is aligned and connected to the third connection hole, and the second connection hole is blocked by the outer wall of the valve spool.

13. The vending machine of claim 12, wherein an extending direction of the second vent hole is same as an extending direction of the third vent hole, the extending direction of the second vent hole is perpendicular to an extending direction of the first vent hole.

14. The vending machine of claim 9, wherein the heat transmitting system comprises an air exhausting fan and an air aspirating fan, the air exhausting fan is located between the first air inlet tube and the heat source, and the air aspirating fan is located between the second air inlet tube and the goods storage space.

15. The vending machine of claim 14, wherein the cabinet defines a first through hole and a second through hole, a second end of the first air inlet tube is inserted into the first through hole to be aligned to the air exhausting fan, and a second end of the second air inlet tube is inserted into the second through hole to be aligned to the air aspirating fan.

16. The vending machine of claim 9, wherein the cabinet comprises a plurality of mounting pins, the gas valve defines a plurality of mounting holes, and each of the plurality of mounting pins is inserted into each of the plurality of mounting holes.

* * * * *